United States Patent [19]
Mumper et al.

[11] Patent Number: 5,164,613
[45] Date of Patent: Nov. 17, 1992

[54] RESET MONITOR

[75] Inventors: Eric W. Mumper, Dallas; Francis A. Scherpenberg, Carrollton; William L. Payne, II, Garland, all of Tex.

[73] Assignee: Dallas Semiconductor Corporation, Dallas, Tex.

[21] Appl. No.: 731,287

[22] Filed: Jul. 16, 1991

Related U.S. Application Data

[63] Continuation of Ser. No. 590,378, Sep. 28, 1990, abandoned.

[51] Int. Cl.[5] .......................... H03K 3/01; H03K 5/00
[52] U.S. Cl. ................ 307/272.3; 307/296.4; 307/296.5; 307/592
[58] Field of Search ............ 307/272.3, 592, 594, 307/542, 542.1, 544, 296.4, 296.5, 296.6; 341/24

[56] References Cited

U.S. PATENT DOCUMENTS

| | | | |
|---|---|---|---|
| 4,296,338 | 10/1981 | Thomas | 307/594 |
| 4,367,422 | 1/1983 | Leslie | 307/592 |
| 4,433,390 | 2/1984 | Carp et al. | 307/272.3 |
| 4,473,759 | 9/1984 | Mahabadi | 307/296.5 |
| 4,523,104 | 6/1985 | Norris et al. | 341/24 |
| 4,882,506 | 11/1989 | Johansson et al. | 307/296.4 |
| 4,902,910 | 2/1990 | Hsieh | 307/296.5 |
| 4,945,300 | 7/1990 | Sato et al. | 307/592 |

OTHER PUBLICATIONS

Variable Threshold Method for Elimination of Key Bounce; D. E. Fisher and P. Pleshko; IBM Tech. Disc. Bull; Apr. 1971.

*Primary Examiner*—David Hudspeth
*Assistant Examiner*—Andrew Sanders
*Attorney, Agent, or Firm*—Worsham, Forsythe, Sampels & Wooldridge

[57] ABSTRACT

Reset monitor for detection of power failure and external reset for devices such as microprocessors with the reset monitor providing a single settling time hold down of a reset signal. Preferred embodiments include bandgap reference with high current side compensating resistor, bond out options for analog parameter selection, glitch free state machine control of both detections, and external pushbutton debouncing both depression and release.

10 Claims, 8 Drawing Sheets

5,164,613

RESET MONITOR

This is a continuation of application Ser. No. 590,378, filed Sep. 28, 1990, now abandoned.

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO RELATED APPLICATIONS

The following U.S. patent applications contain related subject matter and were filed on even date: Ser. Nos: 590278, 589930, 589937, and 590381. These cross-referenced applications are all assigned to the assignee of this application.

BACKGROUND AND SUMMARY OF THE INVENTIONS

The present invention relates to electronic devices, and, more particularly, to semiconductor devices useful in controlling circuitry upon resets such as after power failures and manual overrides.

Power failures for computer systems can lead to loss of all information held in volatile memory, and power surges can damage components. Thus power down and power up routines are typically built into computer systems, and sensors for power failures together with reset signal generators and battery backups are available. For example, Motorola part MC34064 and Mitsumi part PST518 are undervoltage (i.e., power failure) sensors that output a reset signal. These parts rely upon hystersis in the comparator to avoid erratic reset signals.

Similarly, external reset pushbuttons are common for computer systems, but such pushbuttons can bounce and give spurious reset signals that disrupt computer operation. In particular, microprocessors, microcontrollers, and microcomputers typically have only limited or no internal power failure sensors or pushbutton debouncing circuitry, but rather have only a simple reset input and rely upon external information.

The present invention provides a monitor that detects both power failures and pushbutton operation and that provides a reset signal plus a settling time extension of the reset signal.

BRIEF DESCRIPTION OF THE DRAWINGS

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiments, wherein these innovative teachings are advantageously applied to the particular problems of reset monitors. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
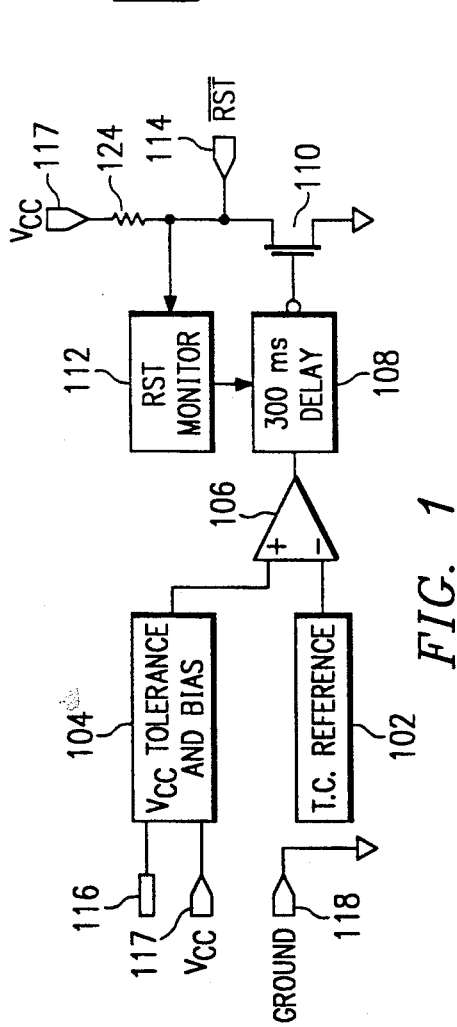
FIG. 1 is a functional block circuit diagram of the first preferred embodiment reset monitor.

FIG. 1 is a functional block diagram of a first preferred embodiment reset monitor, generally denoted by reference numeral 100. Monitor 100 includes temperature compensated reference voltage 102, power source voltage tap 104, comparator 106, delay generator 108, pulldown transistor 110, sampler 112, reset terminal 114, tolerance terminal 116 which is used to select whether a power source voltage ($V_{dd}$ or $V_{cc}$) drop of 10% or 15% is used as a trip point for a power fail signal, power supply terminals 117, ground terminal 118, and internal pull resistor 124.

Monitor 100 two aspects: first, when the power source voltage ($V_{dd}$) is detected as falling out of tolerance (defined by a hardwired selection at terminal 116) as compared to the temperature compensated reference 102, comparator 106 drives delay 108 to immediately turn on transistor 110 and pull reset terminal 114 low (RST\ active low). When the power source voltage returns to within tolerance, comparator 106 releases delay 108, but delay 108 keeps RST\ low for another 350 msec to allow the power source and the controlled device (microprocessor 150 in FIG. 2) to settle before RST\ is released.

Figure 2:
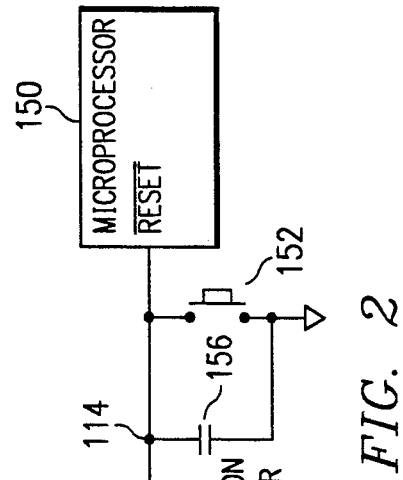
FIG. 2 shows the first preferred embodiment in an application.

The second aspect of monitor 100 detects operation of a pushbutton switch connected to RST\ terminal 114; see pushbutton 152 in FIG. 2. When monitor 100 is not in a reset cycle, it continuously monitors the RST\ signal for a low going edge. If an edge is detected, monitor 100 will debounce the pushbutton switch by pulling RST\ terminal 114 low for a time period determined by an internal timer in delay 108 (about 350 msec). After the internal timer of delay 108 has run its course, monitor 100 will continue to monitor RST\ terminal 114. If the terminal voltage is still low (e.g., finger still on the button), sampler 112 will continue to sample the voltage at terminal 114. Upon detecting a rising edge, monitor 100 will again force RST\ terminal 114 low and hold it low for another 350 msec. This debounces the release of pushbutton 152. The operation of monitor 100 will be considered in greater detail in connection with the following description of its circuitry.

FIG. 2 illustrates monitor 100 connected to microprocessor 150 together with reset pushbutton 152 and capacitor 156.

Figure 3:
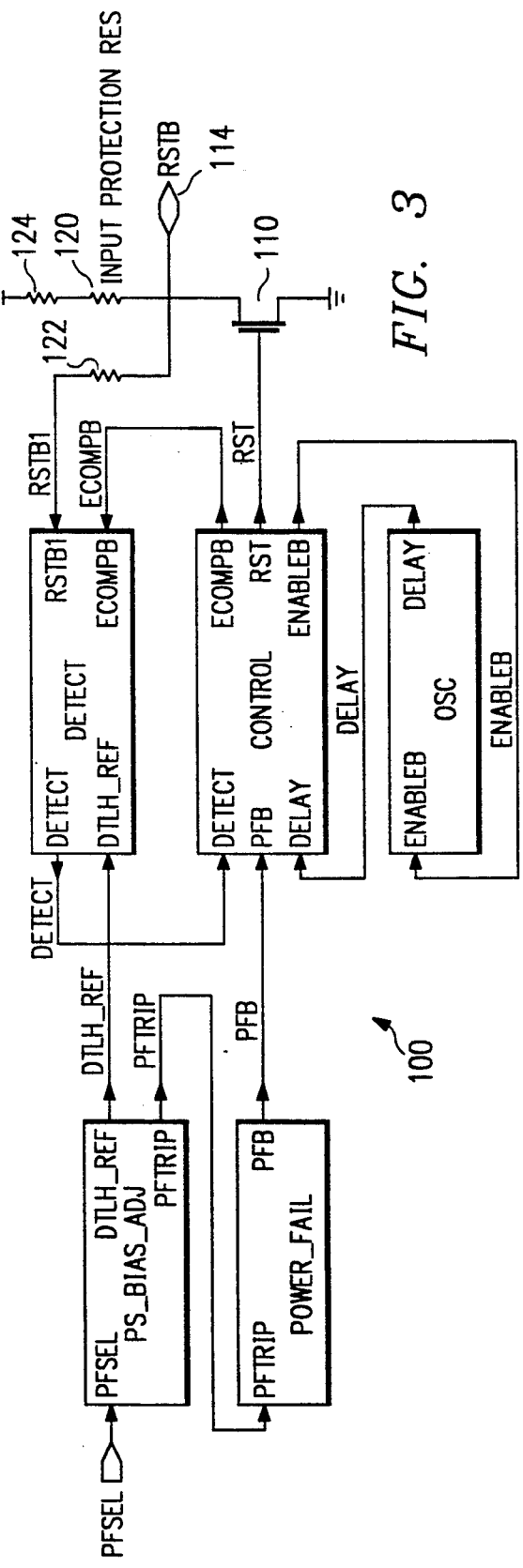
FIG. 3 is a structural block diagram of the first preferred embodiment.

FIG. 3 is a structural block diagram of monitor 100 and shows the following blocks: POWER_FAIL which includes temperature compensated voltage reference 102 and comparator 106, CONTROL which includes a state machine for operational control, DETECT which includes the pushbutton monitoring by sampler 112, OSC which includes an oscillator to generate the time delays of delay 108, and PS_BIAS_ADJ which includes a voltage divider for selecting the fraction of the nominal power supply voltage that $V_{dd}$ must fall in order to trip the power fail signal. Also shown is pull down transistor 110 which has a high width to length ratio of 1000/1.2 expressed in um and thus a small on resistance (about 100 ohms), input protection resistors 120 and 122, and pull up resistor 124 of about 5,000 ohms.

Figure 4:
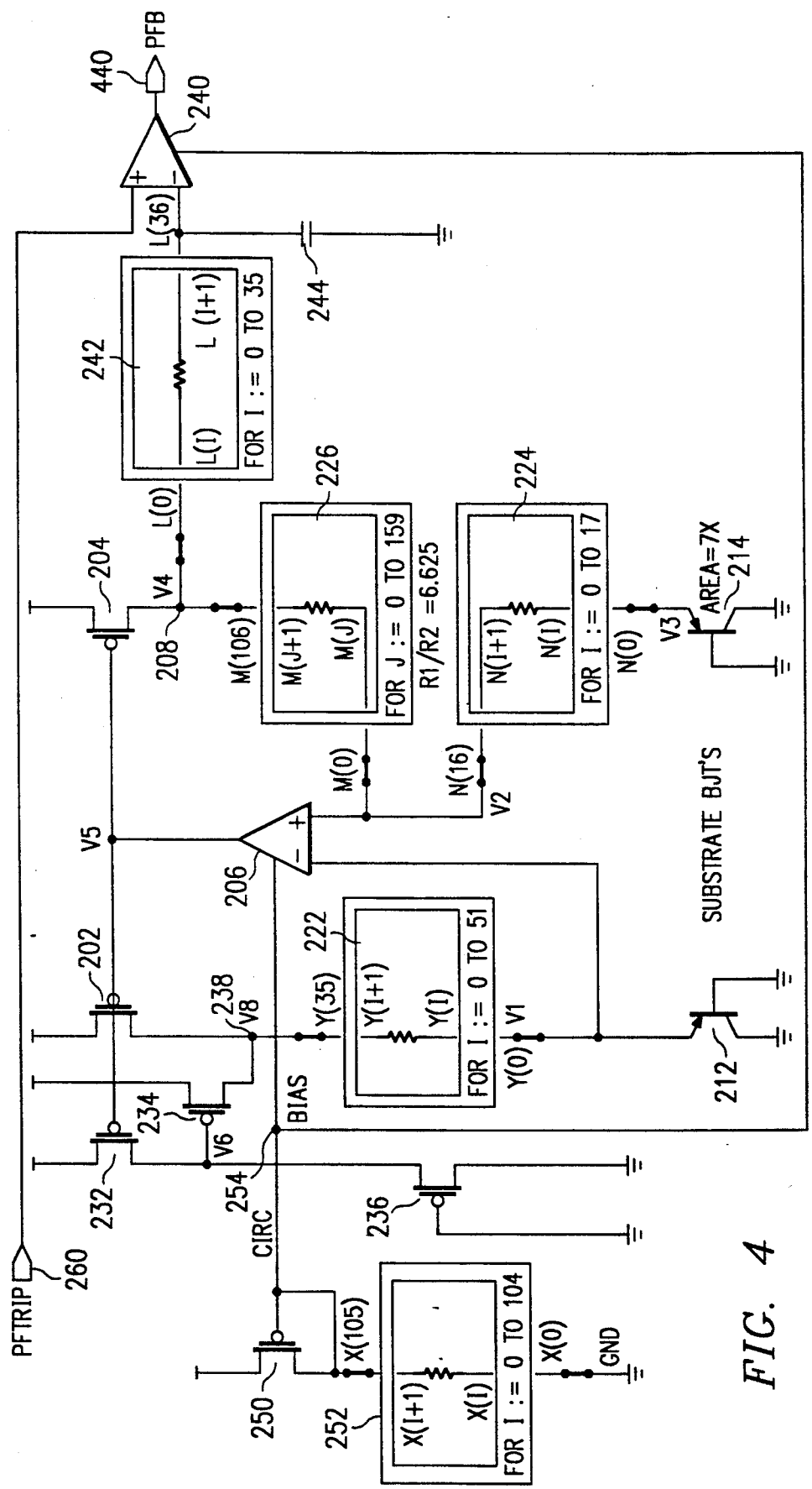
FIGS. 4–5 are schematic circuit diagrams of the power fail block of the first preferred embodiment.

Bandgap Reference. FIG. 4 shows the POWER_FAIL block which includes a bandgap reference circuit made of p-channel FETs 202 and 204, operational amplifier (opamp) 206, pnp substrate bipolar transistors 212 and 214 connected as diodes, resistors 222, 224, and 226, and p-channel FETs 232, 234, and 236. Opamp 240 acts as a comparator of the output of the bandgap reference and the power source voltage at terminal PFTRIP. The bandgap reference output is filtered by resistor 242 and capacitor 244. P-channel FET 250 and resistor 252 provide a current source bias for both opamps 206 and 240. Note that bandgap references in general are not low power devices, but the present bandgap reference does achieve low power consumption due to particular design features.

Figure 5:
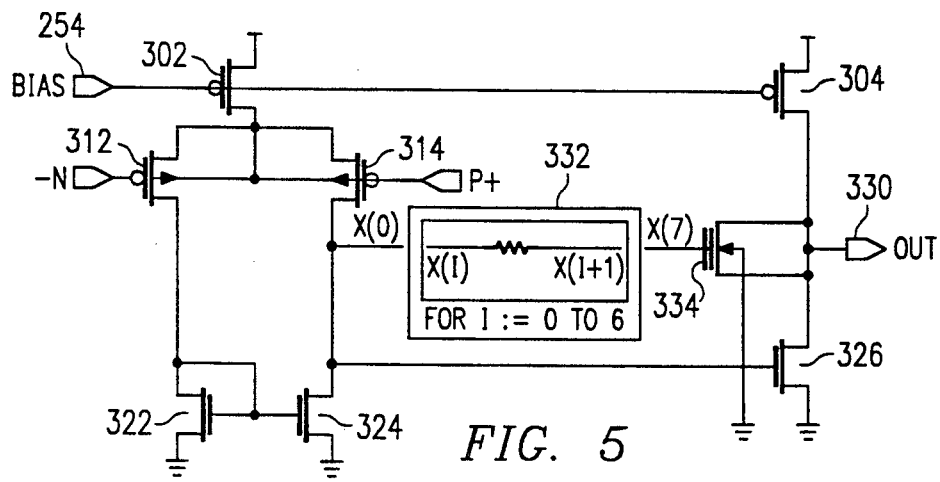

The bandgap reference basically operates in the standard fashion: FETs 202 and 204 are current sources that provide currents to the bipolar transistors 212 and 214 to generate the differential emitter-base voltage drop ($\Delta V_{EB}$) across resistor 224, and opamp 206 provides feedback to set the current level. (FIG. 5 is a schematic diagram of opamp 206 and also of comparator 240.) Resistor 226 multiplies $\Delta V_{EB}$ to have the bandgap reference voltage at node 208 temperature independent. Note that a power supply voltage drop does not affect the emitter-base characteristics and that opamp 206 will compensate for a drop by increasing the gate drive of FETs 202 and 204; a lower power supply voltage appears as a smaller $V_{SD}$ in FETs 202 and 204.

In more detail, FETs 202 and 204 have the same gate lengths (19 um) but the width of FET 202 (27 um) is three times the width of FET 204 (9 um). The gates of FETs 202 and 204 are tied together, and thus the current through FET 202 is three times the current through FET 204. During operation with a power supply voltage of about 5 volts the current through FET 204 will be about 5 uA with a source-to-gate bias of about 2 volts, and $V_{SD}$ will be about 3.9 volts. Thus the power draw of both current paths with a 5 volt power supply totals about 100 uW. Bipolar transistor 214 has 3.5 times the emitter area of bipolar transistor 212, and so the emitter-base voltage drop of 212 is equal to the emitter-base voltage drop of 214 plus $\Delta V_{EB}$ where $\Delta V_{EB}$ equals $(kT/q)\ln(10.5)$. The factor of 10.5 arises from the ratio of the current through 212 to the current through 214 multiplied by the ratio of the emitter area of 214 to the emitter area of 212 (i.e., $3 \times 3.5$). Thus $\Delta V_{EB}$ is roughly equal to 61 mV, and this voltage appears across resistor 224 because the inputs of opamp 206 are at virtually the same voltage. Resistor 226 has 6.625 times the resistance of resistor 224, and thus the reference voltage output at node 208 is equal to the emitter-base voltage drop of bipolar 214 plus $(kT/q)\ln(10.5)(1+6.625)$. The positive temperature coefficient of $(kT/q)\ln(10.5)(7.625)$, which is the voltage drop across resistors 224 plus 226, and just cancels the negative temperature coefficient of the emitter-base voltage drop of bipolar 214 to render the reference voltage at node 208 temperature independent to first order.

Note that if the current through FETs 202 and 204 is too large, then the IR drop across resistor 224 is greater than $\Delta V_{EB}$ and the net input to opamp 206 is positive which is amplified and drives the gates of FETs 202 and 204 more positive and thereby lessens the currents. Conversely, if the current is too small, then opamp 206 decreases the gate voltages of FETs 202 and 204 and thereby increases the currents. And this feedback control by opamp 206 does not depend upon the power supply voltage $V_{dd}$ provided that $V_{dd}$ is large enough to keep opamp 206 active (about 2.5 volts).

Resistor 226 has 3.03 times the resistance of resistor 222, but conducts only one third of the current. Thus resistor 222 provides a voltage drop equal to the voltage drop in resistor 226 and this equalizes the $V_{SD}$ of FETs 202 and 204. Without resistor 226 the bandgap reference would have another source of error. In particular, $V_{SD}$ of FET 202 normally is larger than that of FET 204 (4.3 volts versus 3.9 volts) and changes with temperature whereas that of FET 204 does not. This implies channel length modulation for FET 204 and introduces a source of error in the ratio of the currents through FETs 202 and 204. Indeed, if the temperature increases, then the emitter-base drop of both bipolars decreases and opamp 206 decreases the gate voltages of FETs 202 and 204 to increase the current to compensate by increasing the IR drop in resistors 224 and 226 and increasing the emitter-base drop to keep node 208 at 1.08 volts. However, there is no corresponding IR drop between FET 202 and bipolar 212, so $V_{SD}$ of FET 202 increases and this shortens the effective channel length and increases the current more than just the increase due to the gate voltage adjustment by opamp 206. Hence, rather than having three times the current of FET 204, FET 202 has more than three times the current, and this change in ratio changes logarithm factor in $\Delta V_{EB}$ and thus changes the reference output at node 208.

FETs 232, 234, and 236 provide a startup circuit for the bandgap reference. In particular, on power up it is possible that the positive input to opamp 206 would be 0.1 volt higher than the negative input since the inputs are floating and only connected to ground through junctions in bipolars 212 and 214; and such a differential input to opamp 206 would keep current source FETs 202 and 204 turned off and yield a stable state at zero current through both bipolars 212 and 214. However, if the gates of FETs 202 and 204 are biased to turn off, then FET 232 is also off and FETs 236 and 234 are turned on. This pulls up node 238 and thus the negative input of opamp 206 which, in turn, causes opamp 206 to drive down the bias on the gates of FETs 202 and 204 to turn them on. Opamp 206 simultaneously turns on FET 232 which turns off FET 234 and isolates the start up circuit from the remainder of the bandgap reference. During operation of the bandgap reference, the power drawn by the start up circuit is only about 5 uW because FET 236 has a gate width to length ratio of 3.2/480 expressed in um and presents a resistance of 5 megohms when connected as a diode drawing 1 uA of current. The use of FET 236 rather than a 5 megohm resistor saves area on the integrated circuit substrate.

Power Supply Voltage Detection. The reference voltage at node 208 is fed to the negative input of comparator 240 through the low pass filter made of temperature compensated resistor 242 and capacitor 244. Resistor 242 is polysilicon doped to about $5 \times 10^{15}$ atoms/cm$^3$ which yields a temperature independent resistivity. Resistor 242 has a resistance of about 550 Kohms, and capacitor 244 has a capacitance of about 45 pF. The reference voltage at node 208 is equal to about 1.08 volts and does not vary with the power supply voltage provided there is sufficient voltage to operate opamp 206 and current sources 202 and 204 (about 2.5 volts). Variations in the power supply voltage are compensated for by variations in $V_{SD}$ of the current sources 202 and 204.

FET 250 connected as a diode plus resistor 252 provide a bias voltage of about 4 volts at node 254 if the power supply voltage is 5 volts. Resistor 252 is polysilicon doped to the temperature independent level and has a resistance of about 1.6 megohms; thus the bias generator draws about 12.5 uW. Note that if the power supply voltage falls, then the bias voltage will track this fall and remain about 1 volt (p-channel threshold voltage) below the power supply voltage because FET 250 has a sharp turn on due to its high gate width to length ratio of 128/5 expressed in um. This bias voltage at node 254 is used to bias the current sources in opamp 206 and comparator 240 and constitutes a current mirror with each; see FIG. 5.

FIG. 5 schematically shows the operational amplifier circuit used for both opamp 206 and comparator 240. In particular, the bias at node 254 sets p-channel FETs 302 and 304 to each conduct 2.5 uA if the power supply voltage is 5 volts; thus opamp 206 and comparator 240 each draws about 25 uW with a 5 volt power supply. P-channel FETs 312 and 314 and n-channel FETs 322 and 324 each has the same gate length as FET 302 but only one half the gate width, and n-channel FETs 322 and 324 provide a current mirror load for the differential pair 312-314. Output n-channel FET 326 has the same gate length and width as FET 304, and at the quiescent point the gate voltage of FET 326 will be the same as that of FETs 322 and 324. The output at node 330 will be about 2.0 volts if there is no differential input to FETs 312 and 314. The amplification factor for a differential input at the gates of FETs 314 (positive input) and 312 (negative input) to an output at node 330 is about 300,000 at the quiescent point. Thus a 3 uV difference between the inputs yields about a 1 volt output change. Resistor 332 and capacitor 334 provide a 45 degree phase margin with a 5 pF load on node 330 to keep the opamp from oscillating.

Figure 11:
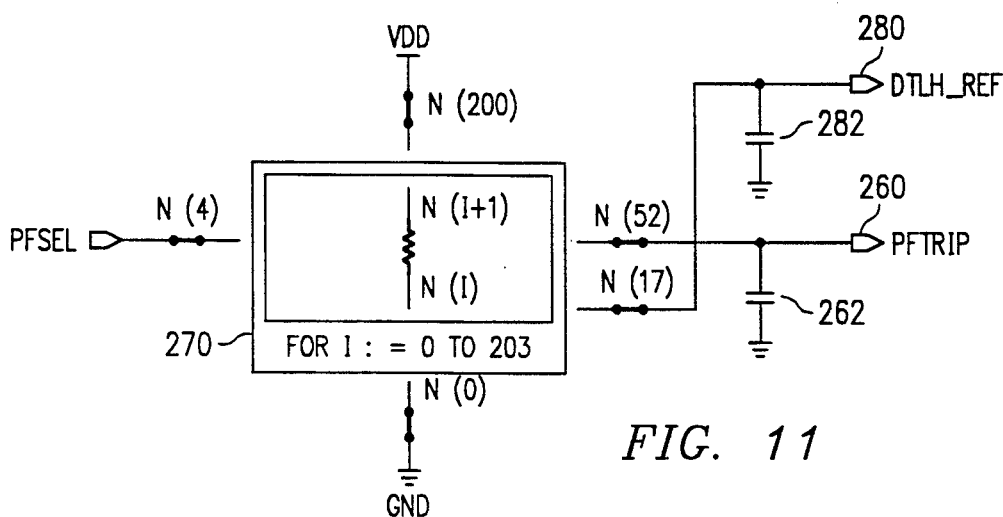
FIG. 11 is a schematic circuit diagram of the ps_bias_adj block of the first preferred embodiment.

For opamp 206 the input levels at the gates of FETs 312 and 314 are both about 0.7 volts, that is, the base-emitter drop of bipolar 212; so FETs 312 and 314 are both turned on hard. For comparator 240 the inputs to FETs 312 and 314 are the bandgap reference voltage at node 208 (about 1.08 volts) and 52/200 $V_{dd}$ at node 260, respectively. FIG. 11 illustrates resistive voltage divider 270 which is made of poysilicon doped to the temperature independent level, and the tap at 52/200 of $V_{dd}$ which is connected to filter capacitor 262 and PFTRIP (Power Fail TRIP) node 260. If $V_{dd}$ is 5.0 volts, then 52/200 $V_{dd}$ is 1.30 volts and the inputs to comparator 240 are a net +220 mV, and the output of comparator is high (5 volts). Now if $V_{dd}$ drops to 4.20 volts, then 52/200 $V_{dd}$ drops to 1.09 volts, whereas the bandgap reference output at node 208 is 1.08 volts. Thus the net input to comparator 240 is +10 mV, and the output of comparator 240 remains high (5 volts). However, if $V_{dd}$ drops to 4.15 then 52/200 $V_{dd}$ equals 1.08 volts and just matches the output of the bandgap reference at node 208. In this case the net input to comparator is 0, and the output drops to about 2 volts. And when $V_{dd}$ drops to 4.10 volts, then 52/200 $V_{dd}$ is 1.07 volts and the net input to comparator 240 is −10 mV and the output falls low (to about 0 volt).

FIG. 11 also shows a tap in resistive voltage divider 270 at 4/200 connected to PFSEL (Power Fail SElect). The preceding analysis presumed that PFSEL floated. Now if PFSEL is tied to ground, then the tap conneced to node 260 sees 48/196 $V_{dd}$ and the voltage at node 260 reaches 1.08 volts when $V_{dd}$ falls to 4.41 volts. Hence, comparator 240 operates as before, but with a switch from high output to low output as $V_{dd}$ drops past 4.41 volts rather than past 4.15 volts.

Figure 7:
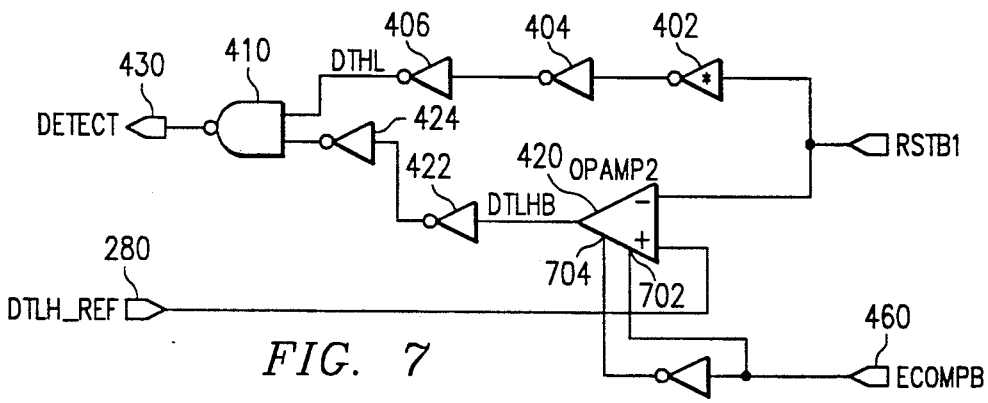
FIGS. 7–8 are a schematic circuit diagram of the detect block of the first preferred embodiment.
Figure 12:
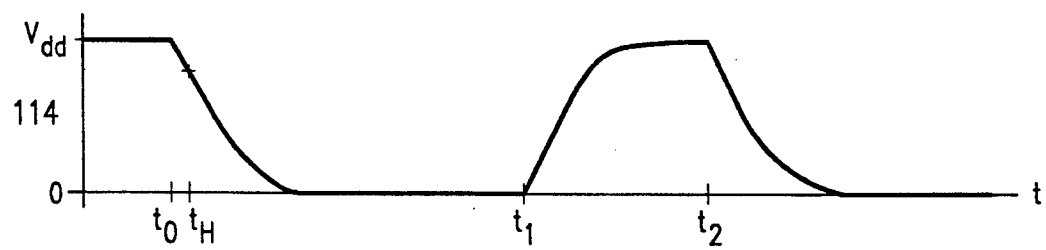
FIG. 12–13 are timing diagrams.
Figure 12:
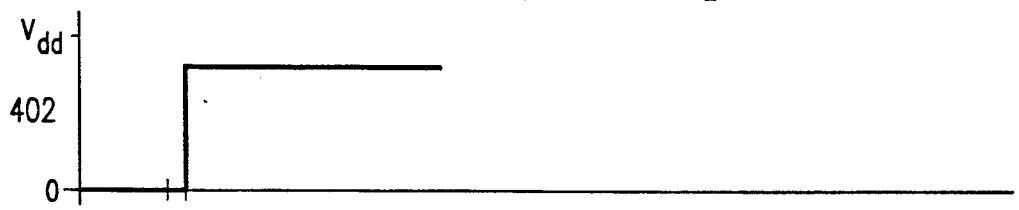
Figure 12:
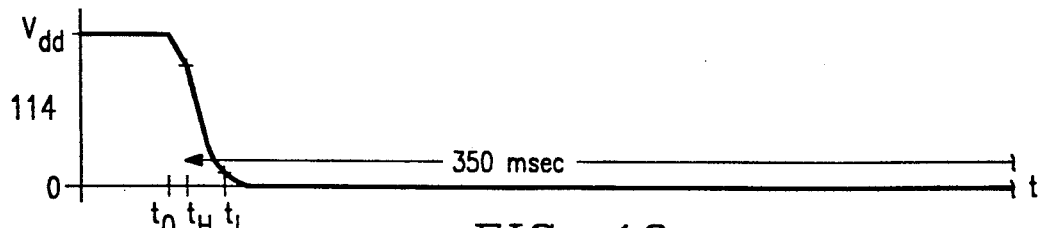

Pushbutton Depression. FIG. 7 is a schematic diagram of the DETECT block of monitor 100 and relates to the pushbutton reset features. In particular, if monitor 100 is inactive and pushbutton 152 is depressed, then the voltage at terminal 114 varies roughly as shown in the first trace of FIG. 12: time t0 is the time of first contact of the pushbutton switch terminals, t1 is the time of the first separation of the terminals due to switch bouncing, t2 is the time of the second contact, and so forth. The time constant for the rising and falling voltage depends upon the stray capacitance and inductance, and the bounce interval depends upon the pushbutton switch materials, but typically the rise/fall time constant is on the order of 5 usec but the bounce interval varies widely.

The response of monitor 100 to the depression of pushbutton switch 152 is to turn on FET 110 and thereby keep terminal 114 low to suppress the otherwise rise in voltage from the bounce at time t1 to time t2. Monitor 100 achieves this as follows. First, the input at terminal RSTB1 (connected to terminal 114 throught resistor 122) in FIG. 7 is $V_{dd}$ up until time t0 when it begins to drop as in the first trace of FIG. 12. When the voltage at RSTB1 drops to about 3 volts (0.6 $V_{dd}$) at time tH, inverter 402 switches from low to high: this high threshold for inverter 402 is implemented by using a standard CMOS inverter structure having a p-channel FET with a gate width to length ratio (in um) of 160/5 and an n-channel FET with a gate width to length ratio of only 20/5. Inverter 402 switching low to high drives inverters 404 and 406 to switch their input to NAND gate 410 from low to high. As noted below, the output of comparator 420 at this time is high. Thus the inputs of NAND gate 410 at time t0 are one high and one low, and at time tH the low input switches high, and this switches the output of NAND gate 410 from high to low.

Figure 6:
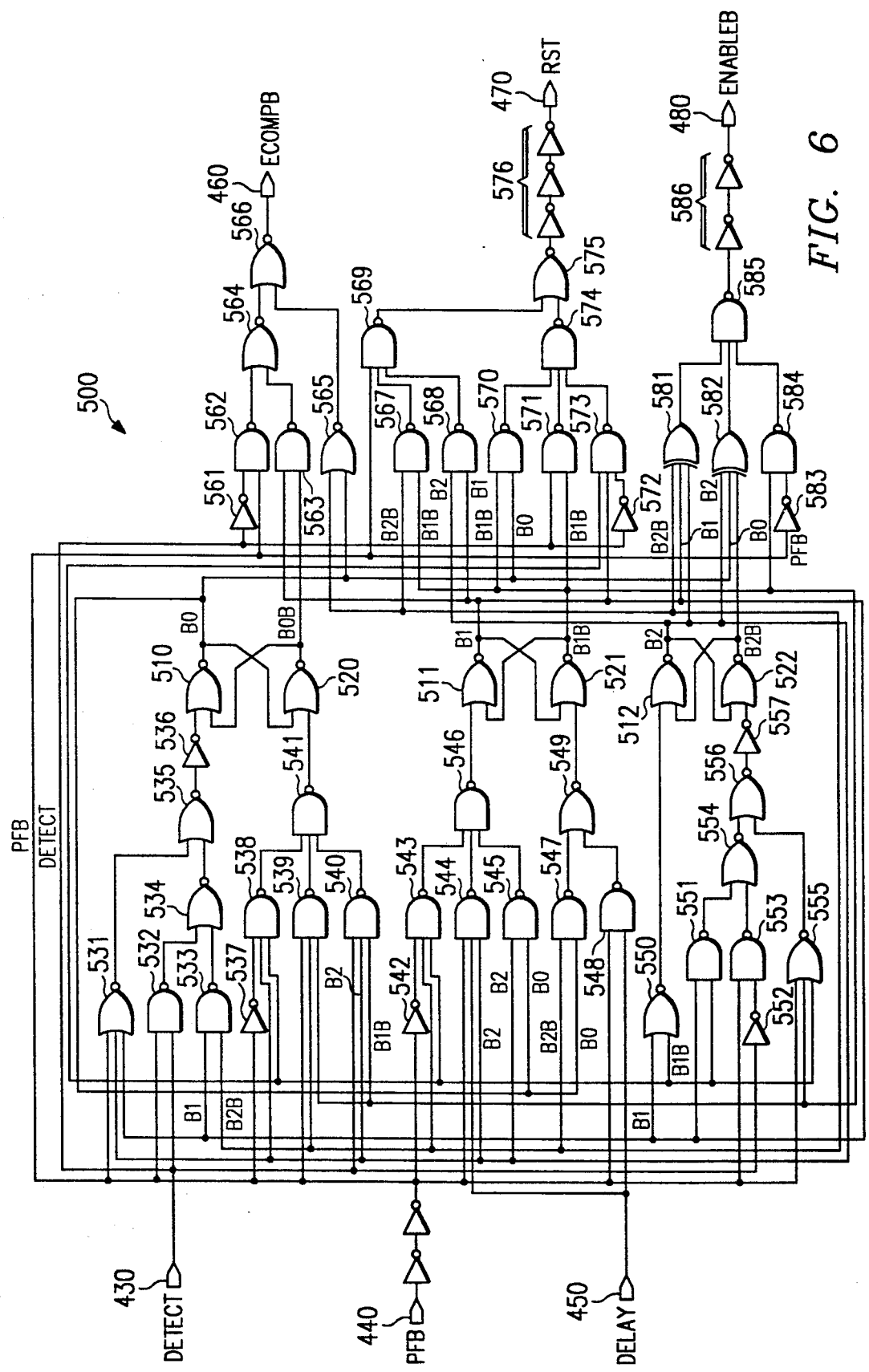
FIG. 6 is a schematic circuit diagram of the control block of the first preferred embodiment.

The output of NAND gate 410 (node 430) provides input to asynchronous state machine 500 of the CONTROL block which is illustrated in FIG. 6. The output of opamp 40 (node 440 in FIG. 4) and the output of counter 602 of the OSC block (node 450 in FIG. 9) are the other two inputs for state machine 500. At just prior to time t0 and with $V_{dd}$ above 4.25 volts (or 4.5 volts if PFSEL is tied to ground) state machine 500 has a high input at node 430 due to $V_{dd}$ being within tolerance and a high input at node 440 due to the high at terminal 114 (RSTB and RSTB1). The input at node 450 is irrelevant under these conditions. State machine 500 includes three latches made of cross-coupled NOR gates: NOR gates 510 and 520, NOR gates 511 and 521, and NOR gates 512 and 522; and the states of these latches defines the state of machine 500. For the inputs at nodes 430 and 440 both high (and for the input at node 450 either high or low) there is only one stable state of state machine 500: NOR gate 510 is low and NOR gate 520 is high, NOR gate 511 is high and NOR gate 521 is low, and NOR gate 512 is low and NOR gate 522 is high. The other possible states are unstable due either to the direct feedback shown in FIG. 6 or to their output that drives the voltage at node 470 (RST) high, which pulls RSTB1 low, and thereby contradicts the presumption that the input at node 430 was high. (If on power up a state with RST high is entered this will be released after a delay as described below.) In this stable state the output at node 470 (RST) is low and the outputs at nodes 460 (ECOMPB) and 480 (ENABLEB) are both high. Node 460 high implies comparator 420 is disabled (see FIGS. 7 and 8) and its output is pulled high as previously noted, and node 480 high implies that counter 602 is in the reset mode and outputting a low at node 450 (DELAY).

At time tH the input at node 430 (DETECT) switches high to low, and state machine 500 switches into the state with NOR gate 512 high and NOR gate 522 low; the other two latches remain unchanged. This transition does not generate glitches, and the transitions in state machine 500 are gray coded so that only one latch at a time switches states. In particular, node 430 (DETECT) going low first switches NAND gate 532 low to high, does not affect NAND gate 540, and switches inverter 552 low to high. These transitions drive NOR gate 534 high to low and NAND gate 553 high to low; this in turn switches NOR gates 535 and 554 both low to high. Then inverter 536 goes low to high to switch one input of latch 510-520 but not change its state, and NOR gate 556 switches high to low. This last change is inverted by inverter 557 and switches the input to latch 512-522 to cause it to change states to NOR gate 512 high and NOR gate 522 low. This state change is fedback as follows. The output of NOR gate 531 remains low, NAND gate 533 switches low to high but this does not affect NOR gate 534, and NAND gates 538, 539, 540, 543, 544, 545, and 547 all remain high. Thus only one latch state switched.

The transition of the input at node 430 (DETECT) from high to low also drives the output at node 470 (RST) from low to high and the output at nodes 460 and 480 both from high to low. As with the latches, no glitches in the outputs appear during the transitions. The transition of node 430 is directly fed to switch the output at node 470 (RST) through inverter 572, NAND gates 573 and 574, NOR gate 575, and inverters 576 without waiting for the change of state of state machine 500. Similarly, the transition at node 430 is directly fed to switch the output at node 480 through inverter 561, NAND gate 562, and NOR gates 564 and 566 without waiting for state machine 500; whereas, the switching of latch 512-522 drives exclusive OR gates 581 and 582 both from low to high to switch node 480 (ENABLEB) from high to low.

Node 470 (RST) going high turns on FET 110 to help pushbutton 152 pull down terminal 114 and hold it down even if pushbutton 152 bounces, node 460 (ECOMPB) going low enables comparator 420, and node 480 (ENABLEB) going low releases the reset of counter 602 and it begins counting the cycles of oscillator 604 to provide a signal after a delay of about 350 msec as described below. This delayed signal will appear at node 450 (DELAY) and drive node 470 (RST) back low, but during the 350 msec that RST was high the pull down by FET 110 suppressed any voltage fluctuation at terminal 114 such as would have occurred with bouncing by pushbutton 152. See the third trace in FIG. 12 which shows the voltage at terminal 114 with monitor 100 suppressing the fluctuations due to bouncing that are shown in the first trace.

Figure 9:
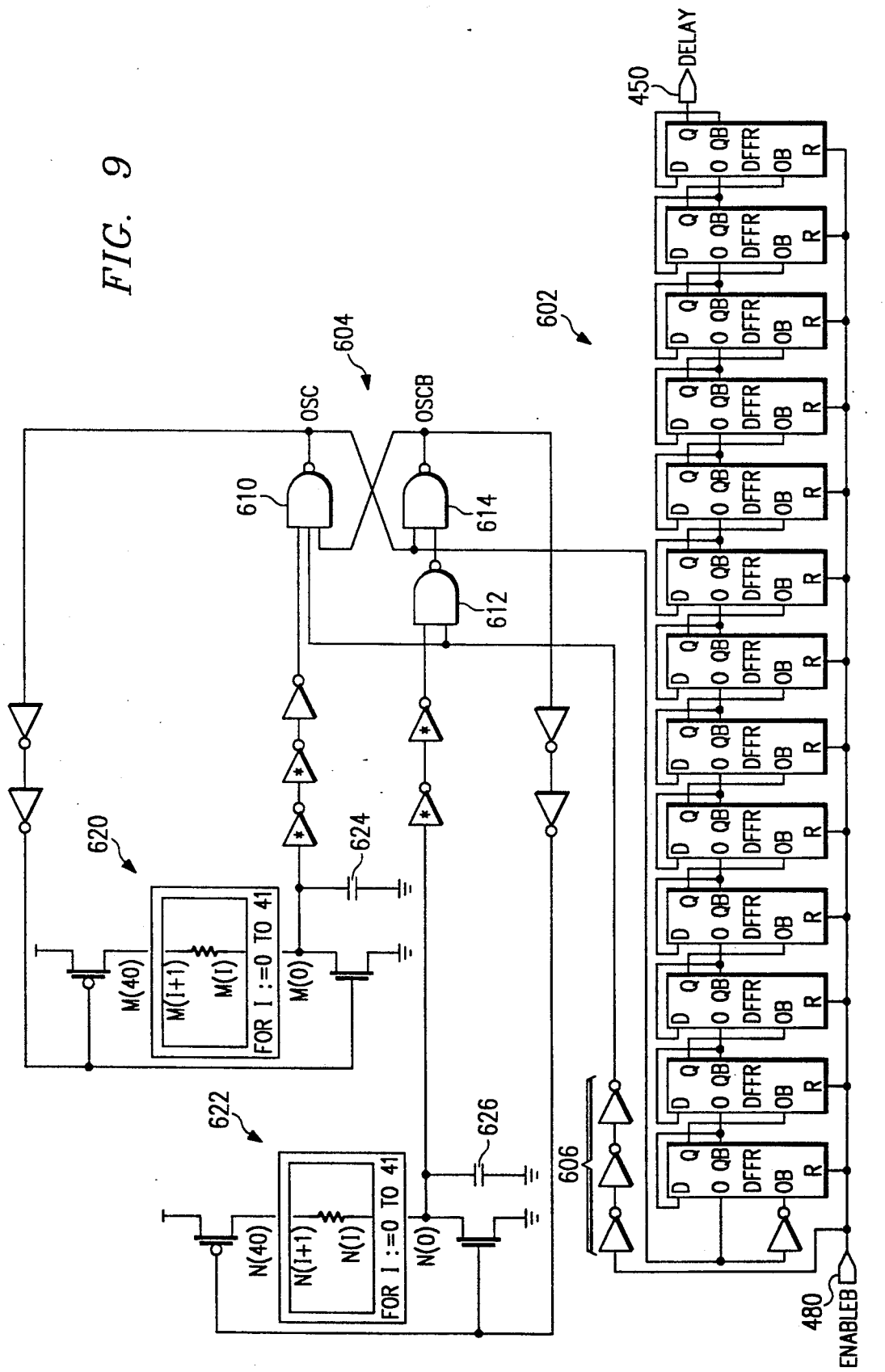
FIGS. 9–10 are a schematic circuit diagram of the osc block of the first preferred embodiment.
Figure 10:
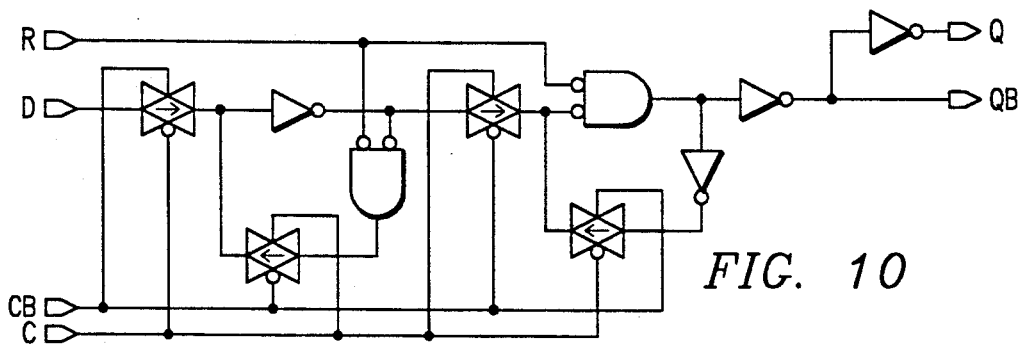

FIG. 9 is a schematic diagram of block OSC and includes counter 602 comprising thirteen flip-flops (each of which is shown schematically in FIG. 10) and oscillator 604 which has two feedback loops with each loop having an inverter including a resistor in series with the pull up p-channel FET and a capacitor tied to the output; the resistor and capacitor provide an RC time delay. Oscillator 604 and counter 602 generate the 350 msec delay as follows. At time t0 and until time tH, the voltage on node 480 (ENABLEB) is high and this provides both a high at reset terminal R for each flip-flop, holding the flip-flop in the Q=0 state (output at terminal Q low and at terminal QB high) and also a low (inversion by inverters 606) input for NAND gates 610 and 612. This low input sets NAND gates 610 and 612 both high, which then sets NAND gate 614 low and inverter 620 low (so capacitor 624 is discharged) and inverter 622 high (so capacitor 626 is charged up). Then when node 480 switches to low, the flip-flops are released from their reset and the low inputs to NAND gates 610 and 612 switch high. Thus NAND gate 612 switches low and then NAND gates 610 and 614 both switch, and this switching is propagated to inverters 620 and 622. Inverter 622 quickly switches low by discharging capacitor 626 through its n-channel FET and thereby propagates the switching to NAND gate 614 where it stops until NAND gate 610 switches. Contrarily, inverter 620 does not output a high until capacitor 624 is charged up by current through its p-channel FET and resistor, this takes about 43 usec. Once inverter 620 outputs a high, this propagates to switch NAND gate 610 and thereby permit the switching propagation of the other feedback loop to pass NAND gate 614 and propagate a low to inverter 622 which (analgous to inverter 620) takes about 43 usec to output a high. Thus oscillator 604 has a period of about 86 usec, and this is used as the clock inputs to the first flip-flop of counter 602. The clock inputs for each other flip-flop of counter 602 comes from the output of the preceeding flip-flop, so the last (thirteenth) flip-flop does not switch from Q=0 to Q=1 for about 350 msec ($2^{12} \times 86$ usec). The output of the last flip-flop appears at node 450

(DELAY), so about 350 msec after tH the voltage at node 450 switches from low to high.

Figure 8:
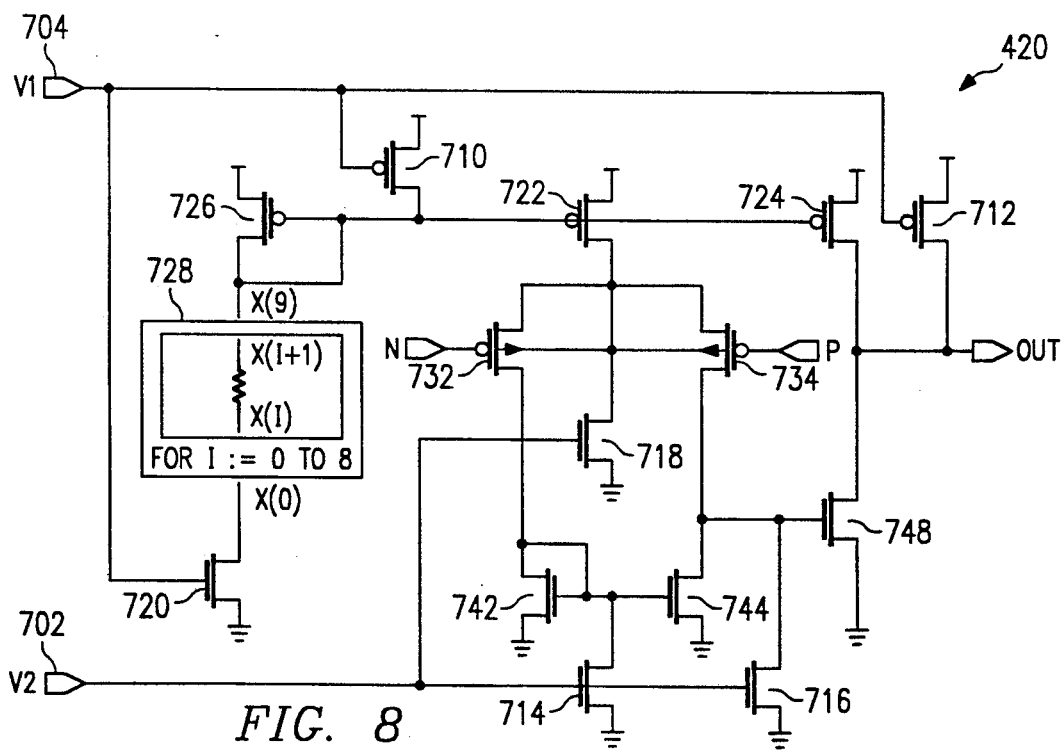

The transition of node 430 (DETECT) from high to low at time tH switches the output at node 460 (ECOMPB) from high to low, and this releases comparator 420 from its disabled state as follows. First, FIGS. 7 and 8 show that a high at node 460 (ECOMPB) applies a low at node 702 and a high at node 704, and these turn on p-channel FETs 710 and 712 and n-channel FETs 714, 716, and 718, respectively, and turn off n-channel 720. This inactivates the comparator circuit (current source FETs 722 and 724, biased by diode-connected FET 726 and resistor 728, differential pair of FETs 732 and 734 for negative and positive inputs, current mirror load FETs 742 and 744, and output FET 748) because the current sources are turned off and internal nodes are grounded, and the output is pulled high by FET 712.

Next, at time tH (plus a few inverter and gate delays) node 460 (ECOMPB) goes high and this switches the high and low on nodes 702 and 704 so that FETs 710, 712, 714, 716, and 718 are all turned off and FET 720 turned on, and activates the comparator circuit. Now as comparator 420 becomes active its negative input (gate of FET 732 connected to node RSTB1) is rapidly being pulled down to ground by FET 110 and its positive input (gate of FET 734 connected to node 280 (DTLH_REF)) is at a fixed voltage of about 0.43 volt (0.32 volt if PFSEL is tied to ground). That is, node 280 taps polysilicon resistor voltage divider 270 at 17/200 $V_{dd}$ (or 13/196 $V_{dd}$ if PFSEL is tied to ground) and connects to filter capacitor 282; thus the positive input to comparator 420 is about 0.43 volt (or 0.32 volt if PFSEL is tied to ground), presuming that $V_{dd}$ is at 5 volts. See FIG. 11.

The time tL at which terminal 114 (RSTB) and node RSTB1 have fallen to 0.43 volt (or 0.32 volt) may occur after comparator 420 has become active due to large stray capacitance at terminal 114 (see the third trace of FIG. 12), so there may be a positive glitch at node 430 (DETECT). Such a positive glitch at node 430 (DETECT) does not lead to glitches in the outputs or the state of state machine 500. In particular, DETECT going high changes (i) the output of inverter 536 back to high, but this does not change the state of latch 510-520, (ii) the output of inverter 557 back to low, but this does not switch latch 512-522 back to its original state despite the fact that DETECT going low had switched this latch, (iii) the output of NOR gate 564 back to low, but NOR gate 565 now holds NOR gate 566 and ECOMP low, and (iv) NAND gate 574 back to high, but NAND gate 569 now holds NOR gate 575 low and RST high. Thus after terminal 114 has been pulled to ground, DETECT will return to low and any glitch effects reversed.

The transition of node 450 (DELAY) from low to high indicating that the 350 msec hold down is complete causes a change of state of state machine 500 as follows. First, the low to high switches NAND gate 544 low and this drives NAND gate 546 high and thus latch 511-521 switches to NOR gate 511 low and NOR gate 521 high. The feedback from this switch of latch 511-521 has no effect on either NOR gates 531, 550, and 555, or on NAND gates 533, 539, and 540, but does switch NAND gate 551 from low to high. This transition of NAND gate 551 then leads to a switching of NOR gates 554 and 556 and inverter 557 so the input to NOR gate 522 of latch 521-522 switches from high to low but does not change the state of the latch. So again the change of state of state machine 500 involves only a single latch state change and without glitches.

Further, the change of state of latch 511-521 changes the output at node 470 (RST) from high to low and thus release the hold down of terminal 114 (RST\), changes the output at node 480 (ENABLEB) from low to high to stop oscillator 604 and put counter 602 into reset, but does not affect the output at node 460 (ECOMPB) because NOR gate 565 high holds NOR gate 566 low. The switch of counter 602 into the reset mode implies a change of node 450 (DELAY) from high back to low, but this does not lead to a state change for state machine 500 because the change of NAND gate 546 from high to low does not change the state of NOR gate 511.

Figure 13:
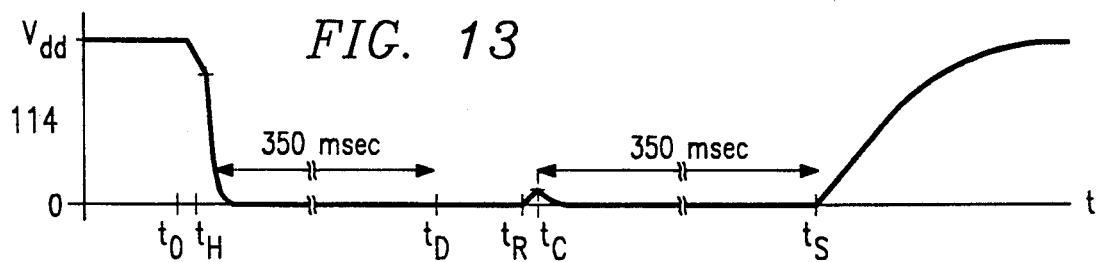

Pushbutton Release. The release of a depressed pushbutton 152 may also lead to bouncing and spurious contacts of the pushbutton terminals, so monitor 100 applies a second 350 msec hold down of RST\ when the voltage of terminal 114 is detected as rising from ground. Note that if the pushbutton had been released prior to the first 350 msec hold down generated upon pushbutton depression, then terminal bounces could still occur after the first 350 msec hold down and the second 350 msec hold down will immediately follow the first 350 msec hold down and suppress such bounces. In particular, when the voltage on terminal 114 (RST\) rises (either because of the release of a depressed pushbutton 152 or because of the transition of node 470 (RST) from high to low due to the first 350 msec time period completion) from ground to 0.43 volt (0.32 volt for PFSEL tied to ground) at time tC, then comparator 420 will change its output from high to low, and this will lead to a high output at node 470 (RST) to again turn on FET 110 and pull down terminal 114 for a second 350 msec. FIG. 13 illustrates the case of the first 350 msec delay completed at time tD prior to the release of pushbutton 152 at time tR, and the subsequent rise of terminal 114 to 0.43 volt at time tC, followed by the second 350 msec hold down until time tS when terminal 114 is fully released. The level of 0.43 volts is chosen to insure that the second hold down will occur without terminal 114 rising out of the TTL logic zero range of 0 to 0.8 volt. The second 350 msec hold down occurs as follows.

Comparator 420 feeds inverter 422 which has a threshold of about 3.5 volts (the high threshold derives from using a p-channel gate width ten times the n-channel gate width), and the output of inverter 422 is inverted by 424 and feeds the one input of NAND gate 410. Thus the detection of a terminal 114 voltage rise to 0.43 volt by comparator 420 changes the inputs of NAND gate 410 from two highs to one high and one low, so the output at node 430 (DETECT) switches from low to high. The transition of node 430 (DETECT) from low to high changes the output at node 470 (RST) from low to high by changes through NAND gates 571 and 574 to NOR gate 575; this high at node 470 (RST) again turns on FET 110 to pull down terminal 114.

The transition of node 430 (DETECT) from low to high also leads to a state change in state machine 500 through NAND gates 540 and 541 to switch latch 510-520 to the state with NOR gate 510 high and NOR gate 520 low.

The state change of latch 510-520 switches node 460 high through NOR gate 565 and this disables comparator 420 as previously described. The state change also feeds back through NOR gate 550 to change the state of latch 512-522 to that with NOR gate 512 low and NOR gate 522 high. This latch state change then drives node 480 (ENABLEB) low to start counter 602 as described above. The feedback of the state change of latch 512-522 does switch NAND gate 546 from low to high and does juggle NAND gates 539 and 540, but neither of these changes affect the latch states because the respective NOR gates are held low by the cross coupling.

The pull down of terminal 114 by the high at node 470 (RST) also drives node 430 (DETECT) low because the input to comparator 420 is again a net positive. But the change in node 430 does not affect the states of the latches nor the outputs.

Again, after 350 msec, counter 602 outputs a high to node 450 (DELAY), and this transition propagates through NAND gate 548 and NOR gate 549 to switch latch 511-521 into the state with NOR gate 511 high and NOR gate 521 low. On feedback this state change does not switch either of the other two latches, but the state change switches the output at node 470 (RST) low and the output at node 480 (ENABLEB) high. This releases the hold down of terminal 114 and turns off oscillator 604 and puts counter 602 into reset. The reset of counter 602 implies the voltage on node 450 (DELAY) goes low, but this switches NAND gate 548 and NOR gate 549 but does not change the state of latch 511-521.

With the hold down of terminal 114 released, the voltage on node 114 rises to $V_{dd}$, and comparator 420 is disabled and does not prevent the voltage rise due to the state of latch 510-520. Once the voltage on terminal 114 reaches about 3 volts, inverter 402 changes from high to low and this propagates to switch node 430 (DETECT) from low to high. This low to high transition at node 430 propagates through NAND gate 532, NOR gates 534 and 535, and inverter 536 to switch latch 510-520 into the NOR gate 510 low and NOR gate 520 high state. Thus state machine has returned to its initial condition at time t0.

Power Supply Failure. If $V_{dd}$ falls below 4.125 volts (4.375 if PFSEL is tied to ground), then the voltage at node 440 (PFB) switches from high to low (of course, all the highs are scaled down by this fall of $V_{dd}$), and this transition then drives NAND gate 569 high, NOR gate 575 low, and inverters 576 high to have node 470 (RST) high and turn on FET 110 to pull down terminal 114. Thus a reset signal is quickly generated once $V_{dd}$ falls out of tolerance and is continued as long as $V_{dd}$ remains out of tolerance.

The transition of node 440 (PFB) from high to low also propagates through inverter 542 and NAND gates 543 and 546 to switch latch 511-512 into the NOR gate 511 low and NOR gate 521 high state. This change of state of latch 511-521 feedsback but does not change the states of either of the other two latches. However, the transition of node 470 (RST) high and consequent pull down of terminal 114 implies that node RSTB1 has gone to ground and thus node 430 (DETECT) also has gone low (recall comparator 420 is disabled). The transition of node 430 (DETECT) from high to low does not affect the state of any of the latches and does not change any of the outputs.

If $V_{dd}$ returns to above 4.125 volts, then the voltage on node 440 (PFB) switches back to high, and this change propagates through NAND gate 539 and 541 to switch latch 510-520 into the NOR gate 510 high and NOR gate 520 low state. This state change drives output node 480 (ENABLEB) low to turn on oscillator 604 and start counter 602, but the feedback from this state change does not affect the state of either other latch. State machine 500 is now in the same state as during the second 350 msec hold down described previously. Thus 350 msec after $V_{dd}$ has returned to within tolerance, FET 110 is turned off and terminal 114 rises to $V_{dd}$ to terminate the active reset (RST\).

Note that if $V_{dd}$ falls out of tolerance during the 350 msec hold down, then the low going transition at node 430 propagates through NOR gates 531 and 535 and inverter 536 to switch latch 510-520 back and this drives exclusive OR gate 582 low to stop counter 602 and return state machine 500 to the previous condition just prior to $V_{dd}$ returning to within tolerance. Further, the use of oscillator 604 and counter 602 to generate the settling time together with the RC filters from capacitors 262 and 282 implies input hysterisis is not needed to avoid unstable behavior.

Figure 14:
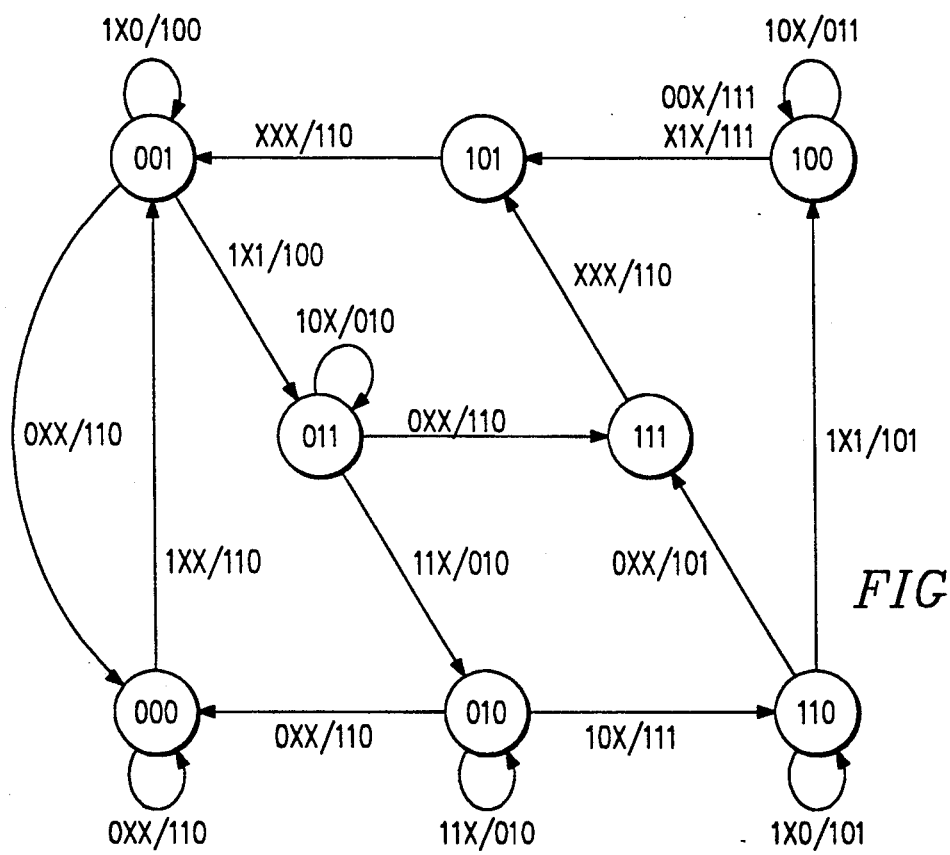
FIG. 14 is a state diagram for the first preferred embodiment.

FIG. 14 is a state diagram for state machine 500 and summarizes the foregoing description of its operation. In FIG. 14 each circle represents a state of state machine 500, that is, the three numbers indicate a set of states of the three latches. The first three transition numbers represent the three inputs (PFB, DETECT, and DELAY) and the second three transition numbers following the slash represent the three outputs (RST, ENABLEB, and ECOMP).

Figure 15:
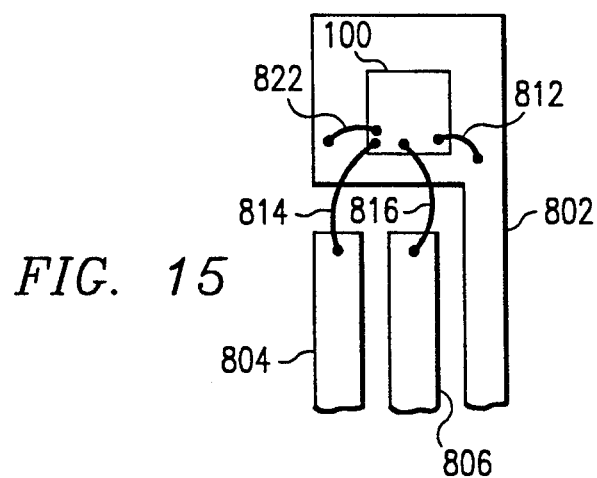
FIG. 15 shows packaging bond selection.

Tolerance Selection. Monitor 100 can be fabricated as a fairly small integrated circuit and put in a low-cost TO-92 package. FIG. 15 shows monitor 100 in the form of an integrated circuit mounted on a ground pin 802 with power supply pin 804 and reset pin 806 aligned as in assembly of TO-92 plastic packages. Bond wire 812 connects a ground pad of monitor 100 to ground pin 802; similarly bond wires 814 and 816 connect power supply and output pads to power supply pin 804 and reset pin 806. If PFSEL is to be tied to ground, then bond wire 822 is added connecting a pad for PFSEL to ground pin 802. Thus a simple selection of tolerance levels can be made by programming the bonding machine during packaging of monitor 100. This approach to analog parameter selection avoids the need for processes such as laser fuse blowing metal level mask changes.

Figure 16A:
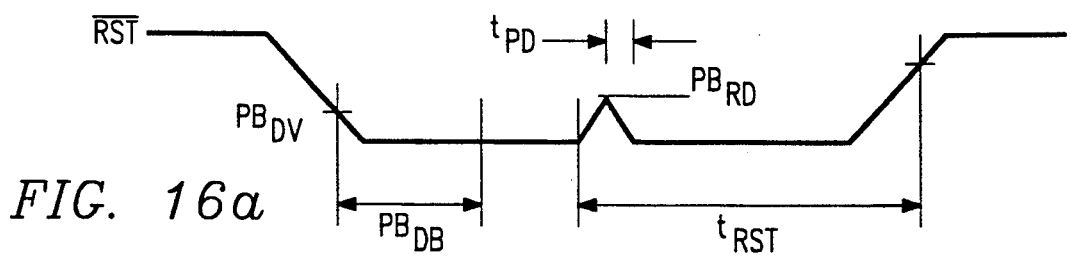
FIGS. 16a–c are timing diagrams.
Figure 16B:
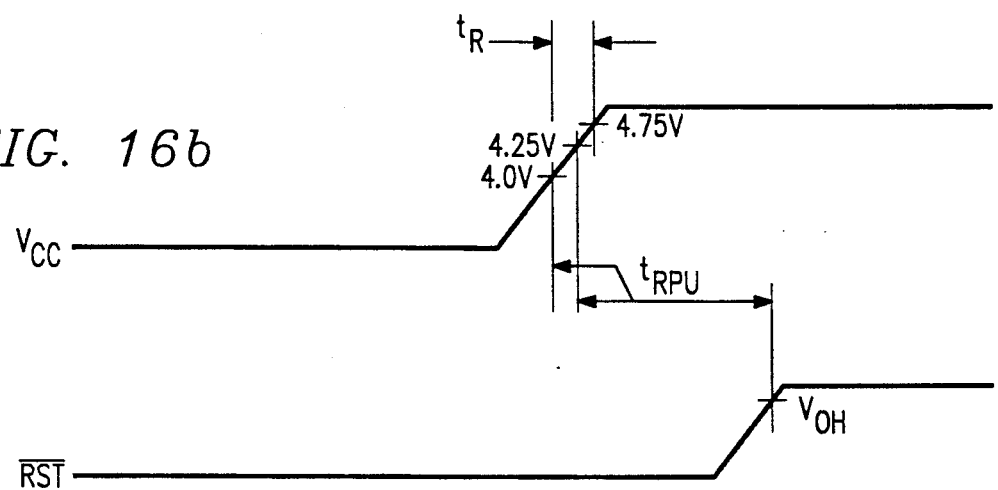
Figure 16C:
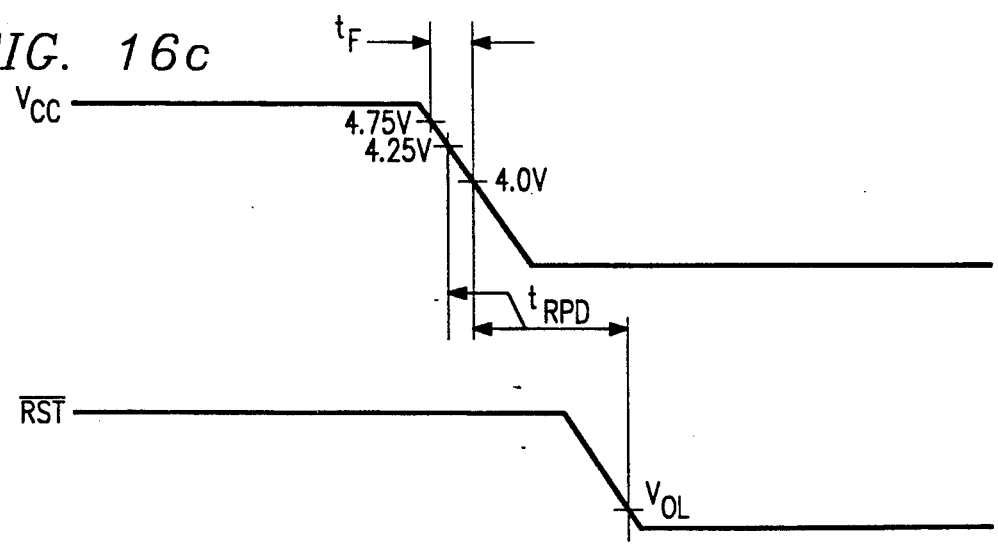

Fabrication. Monitor 100 can be fabricated with a 1.2 um polysilicon gate silicon CMOS process, and all of the gate length and widths noted on the drawings relate to such a process. Other processes and materials are substitutable. With a 1.2 um process, the following timings illustrated in FIGS. 16a-c and can be achieved: $V_{dd}$ out of tolerance detection to RST\ low ($t_{RPD}$) within 100 nsec; pushbutton release detection to RST\ low ($t_{PD}$) within 100 nsec; the hold down times ($t_{RST}$, $PB_{DB}$, and $t_{RPU}$) are set by the oscillator and counter. Monitor 100 draws a maximum of 50 uA (250 uW) when quiescent; the bulk of this power consumption is in the bandgap reference. Recall that the ocillator, counter, and comparator are turned off when not active.

Further Modifications and Variations

The preferred embodiments may be modified in many ways while retaining one of more of the features of combined power failure and pushbutton detections with a settling time generator, debouncing both the depression and release of the pushbutton, analog parameter selection by a bond out choice, a bandgap reference with a high current side equalization resistor, and a glitch free control of the combined power failure and pushbutton detection and settling time generation. Simple modifications include parameters changes such as different trip points, different timing, different number of bond out options, different resistances, capacitances, and currents, different static voltage levels such as negative or positive reference in lieu of ground and different polarities and multiple power supplies, multiple reset terminals, Zener diode rather than a bandgap reference, and so forth.

What is claimed is:

1. An integrated circuit, comprising:
   (a) a power supply terminal;
   (b) a second terminal;
   (c) a reference supply terminal;
   (d) a first detector for detecting a change of magnitude of the voltage of said power supply terminal relative to said reference supply terminal from greater than to less than a first predetermined voltage;
   (e) a second detector for detecting a change of the magnitude of the voltage of said second terminal relative to said reference supply terminal from greater than to less than a second predetermined voltage; and
   (f) control circuitry that (i) connects said second terminal to said reference supply terminal when said first detector detects said change of the voltage of said power supply terminal relative to said reference supply terminal to less than said first predetermined voltage and maintains said connect for a first predetermined time period, and that (ii) connects said second terminal to said reference supply terminal when said second detector detects said change of voltage of said second terminal relative to said reference supply terminal to less than said second predetermined voltage and maintains said connect for a second predetermined time period.

2. The integrated circuit of claim 1, wherein:
   (a) said reference supply terminal is connected to ground.

3. The integrated circuit of claim 1, wherein:
   (a) said first predetermined time period and said second predetermined time period are both generated by a time period generator.

4. The integrated circuit of claim 3, wherein:
   (a) said time period generator includes an oscillator and a counter.

5. An integrated circuit, comprising:
   (a) a power supply voltage detector;
   (b) a reset terminal voltage detector connected to a reset terminal;
   (c) a time period generator; and
   (d) control circuitry connected to said detectors and that outputs a reset signal at said reset terminal for a time period determined by said generator when either (i) said power supply voltage detector detects a power supply voltage magnitude falling below a first predetermined level or (ii) said reset terminal voltage detector detects a voltage magnitude at said reset terminal indicating an external reset signal at said reset terminal.

6. A method of controlling a reset terminal, comprising the steps of:
   (a) detecting when either (1) a power supply voltage magnitude becomes less than a first voltage or (2) a reset terminal voltage indicates a reset signal has been applied to said reset terminal; and
   (b) responsive to an occurrence of one of the two possible conditions above, applying a signal to said reset terminal for at least a predetermined time period.

7. The method of claim 6, wherein:
   (a) said applying a signal includes connecting said reset terminal to a reference voltage supply.

8. The integrated circuit of claim 5, wherein:
   (a) said power supply voltage detector includes a temperature compensated voltage reference generator.

9. The integrated circuit of claim 5, wherein:
   (a) said power supply voltage detector detects when a power supply voltage falls below a first preselected fraction of a nominal power supply voltage; and
   (b) a detected external reset signal at said reset terminal is a voltage falling below a second preselected fraction of aid power supply voltage.

10. The integrated circuit of claim 9, further comprising:
    (a) a second reset terminal voltage detector connected to said reset terminal and to said control circuitry; and
    (b) said control circuitry outputs a second reset signal at said reset terminal when said second reset terminal detector detects a voltage rising above a third preselected fraction of said power supply voltage following a prior reset signal by said control circuitry.

* * * * *